(12) United States Patent
Kobayashi

(10) Patent No.: US 10,964,573 B2
(45) Date of Patent: Mar. 30, 2021

(54) CEILING CARRIER VEHICLE

(71) Applicant: MURATA MACHINERY, LTD., Kyoto (JP)

(72) Inventor: Makoto Kobayashi, Ise (JP)

(73) Assignee: MURATA MACHINERY, LTD., Kyoto (JP)

(*) Notice: Subject to any disclaimer, the term of this patent is extended or adjusted under 35 U.S.C. 154(b) by 29 days.

(21) Appl. No.: 16/489,709

(22) PCT Filed: Feb. 13, 2018

(86) PCT No.: PCT/JP2018/004912
§ 371 (c)(1),
(2) Date: Aug. 29, 2019

(87) PCT Pub. No.: WO2018/179931
PCT Pub. Date: Oct. 4, 2018

(65) Prior Publication Data
US 2020/0013652 A1 Jan. 9, 2020

(30) Foreign Application Priority Data
Mar. 28, 2017 (JP) .............................. JP2017-063325

(51) Int. Cl.
*H01L 21/67* (2006.01)
*H01L 21/677* (2006.01)
*B66C 13/18* (2006.01)
*B66C 19/00* (2006.01)

(52) U.S. Cl.
CPC ........ *H01L 21/67733* (2013.01); *B66C 13/18* (2013.01); *B66C 19/00* (2013.01)

(58) Field of Classification Search
None
See application file for complete search history.

(56) References Cited

U.S. PATENT DOCUMENTS 10,242,898 B2 * 3/2019 Kinugawa ......... H01L 21/67733
2005/0011851 A1    1/2005 Ikeya

FOREIGN PATENT DOCUMENTS

| JP | 2000-072378 A | 3/2000 |
| JP | 2005-035770 A | 2/2005 |
| JP | 4239748 B2 | 3/2009 |
| JP | 2016-163001 A | 9/2016 |

OTHER PUBLICATIONS

Official Communication issued in International Patent Application No. PCT/JP2018/004912, dated Apr. 24, 2018.
English translation of Official Communication issued in International Patent Application No. PCT/JP2018/004912, dated Oct. 10, 2019.

* cited by examiner

*Primary Examiner* — Ronald P Jarrett
(74) *Attorney, Agent, or Firm* — Keating & Bennett, LLP

(57) ABSTRACT

An overhead transport vehicle includes a traveler to travel along a traveling rail, an elevator provided to the traveler, a holder to be raised and lowered by the elevator and to hold a flange included in a container, a positioner to ascend and descend with respect to the holder and to engage with a recess in the flange, a detector to detect a relative ascending operation of the positioner with respect to the holder, and a controller to recognize that the container is disposed on a mounting surface of a transfer destination when the detector detects the ascending operation in a case where the holder is lowered by the elevator.

2 Claims, 7 Drawing Sheets

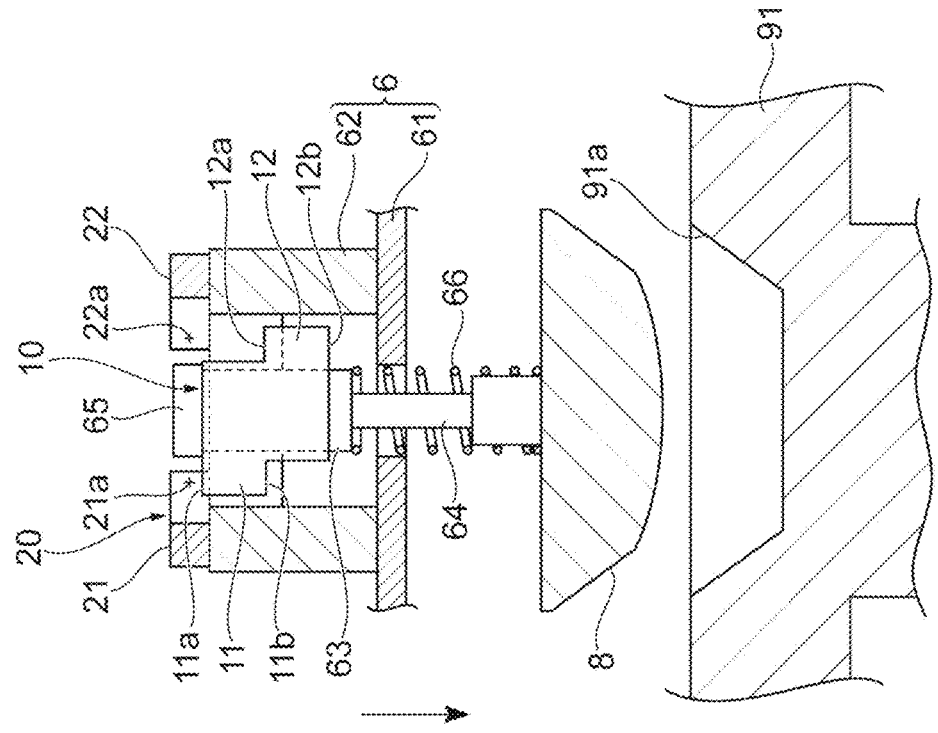
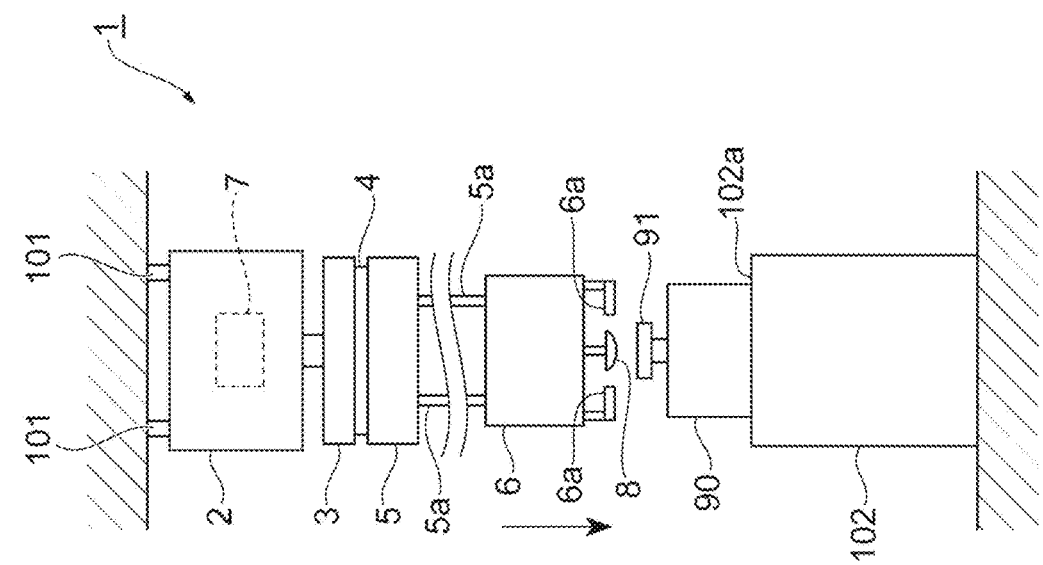

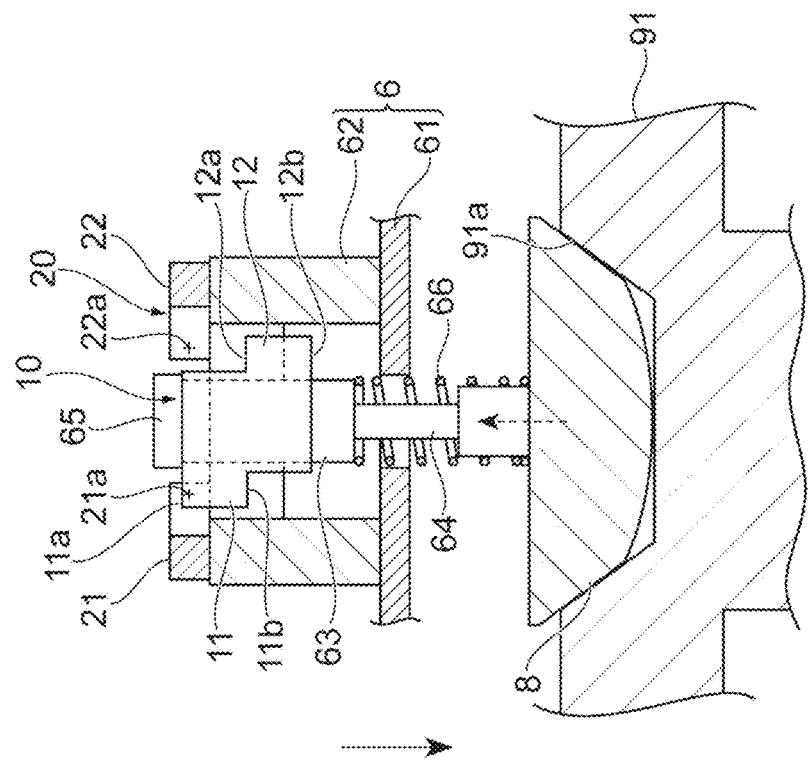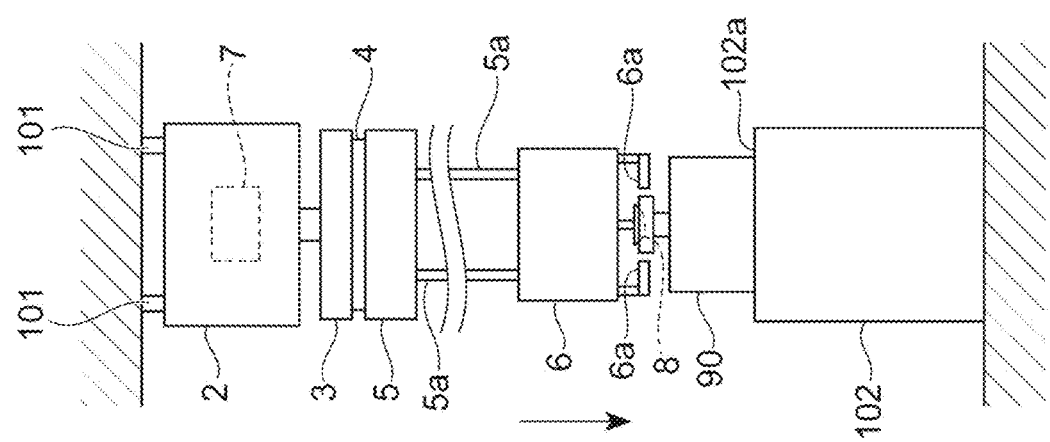

CEILING CARRIER VEHICLE

BACKGROUND OF THE INVENTION

1. Field of the Invention

The present disclosure relates to an overhead transport vehicle.

2. Description of the Related Art

An overhead transport vehicle including: a traveling unit configured to travel along a traveling rail; a lifting unit attached to the traveling unit; a holding unit configured to be raised and lowered by the lifting unit and configured to hold a flange portion included in a container; and an optical sensor of light emitting and receiving type attached to the holding unit and configured to detect the flange portion is known (for example, see Japanese Patent No. 4239748).

In the above-mentioned overhead transport vehicle, to recover a container (front opening unified pod (FOUP), for example) on a mounting surface of a transfer destination (load port, for example), the holding unit is lowered by the lifting unit. At that time, since the overhead transport vehicle is configured such that the light emitting and receiving optical sensor can detect the flange portion of the container, it is possible to recognize that the container is disposed on the mounting surface of the transfer destination. However, in some cases, according to a certain feature such as a shape and a color of the flange portion, it may be difficult for the overhead transport vehicle to accurately recognize that a container is disposed on the mounting surface of the transfer destination.

SUMMARY OF THE INVENTION

Preferred embodiments of the present invention provide overhead transport vehicles that are each able to accurately recognize that a container is disposed on a mounting surface of the transfer destination.

An overhead transport vehicle of one aspect of the present disclosure includes a traveler to travel along a traveling rail, an elevator attached to the traveler, a holder to be raised or lowered by the elevator and to hold a flange included in a container, a positioner to ascend and descend with respect to the holder and to engage with a recess in the flange, a detector to detect a relative ascending operation of the positioner with respect to the holder, and a controller to recognize that a container is disposed on the mounting surface of the transfer destination when the detector detects an ascending operation in a case where the holder is lowered by the elevator.

The present overhead transport vehicle detects a relative ascending operation of the positioner with respect to the holder, so as to recognize that the container is disposed on the mounting surface of the transfer destination. Consequently, for example, unlike an overhead transport vehicle configured to detect a flange of a container using a light emitting and receiving type optical sensor, an overhead transport vehicle according to a preferred embodiment of the present invention is not affected by a shape, a color, or other features of the flange. Thus, in the overhead transport vehicle according to a preferred embodiment of the present invention, it is possible to accurately recognize that the container is disposed on the mounting surface of the transfer destination.

In an overhead transport vehicle according to one aspect of a preferred embodiment of the present invention, the controller may recognize that the holder reaches a holding position when the detector further detects an ascending operation in a case where the holder is further lowered by the elevator. Consequently, it is possible to accurately recognize that the holder reaches the holding position.

An overhead transport vehicle of one aspect of a preferred embodiment of the present disclosure further includes a dog to ascend and descend in association with ascending and descending operations of the positioner with respect to the holder, and the detector may detect a position of the dog. Consequently, with a simple configuration, it is possible to detect a relative ascending operation of the positioner with respect to the holder.

In an overhead transport vehicle of one aspect of a preferred embodiment of the present disclosure, the dog includes a first screen including a first upper end and a first lower end, and a second screen including a second upper end and a second lower end, the detector includes a first photo interrupter to detect a position of the first screen, and a second photo interrupter to detect a position of the second screen, the first lower end and the second upper end are positioned at the same height, and an optical axis of the first photo interrupter and an optical axis of the second photo interrupter may be positioned at the same height. This configuration allows determination based on both output from a light receiver of the first photo interrupter and output from a light receiver of the second photo interrupter, to provide more accurate detection of a relative ascending operation of the positioner with respect to the holder.

According to preferred embodiments of the present disclosure, overhead transport vehicles are each able to accurately recognize that a container is disposed on a mounting surface of a transfer destination.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 4A and 4B are explanatory views of operations of the overhead transport vehicle in FIG. 1.

FIGS. 5A and 5B are explanatory views of operations of the overhead transport vehicle in FIG. 1.

DETAILED DESCRIPTION OF THE PREFERRED EMBODIMENTS

Preferred embodiments of the present invention will now be described in detail with reference to the drawings. In the description of the drawings, like elements are designated by like reference signs, and duplicated explanation is omitted.

Figure 1:
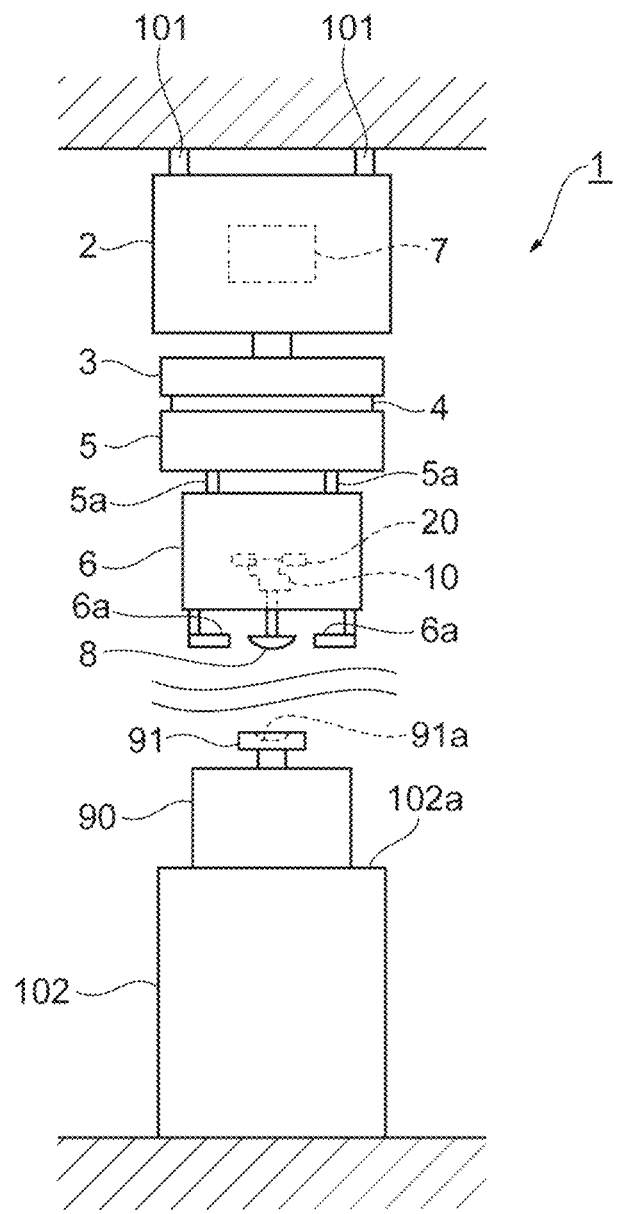
FIG. 1 is a front view illustrating an overhead transport vehicle according to a preferred embodiment of the present invention.

As depicted in FIG. 1, the overhead transport vehicle 1 travels along a traveling rail 101 laid at or near a ceiling of a clean room where semiconductor devices are manufactured, for example. The overhead transport vehicle 1 conveys a FOUP (container) 90 in which a plurality of semiconductor wafers are accommodated. The overhead transport vehicle 1 transfers the FOUP 90 with respect to a load port (transfer destination) 102 attached to a processing apparatus with which a semiconductor wafer is provided with various kinds of treatments. Specifically, the overhead transport vehicle 1 recovers the FOUP 90 disposed on a mounting surface 102a of the load port 102 or disposes the FOUP 90 on the mounting surface 102a of the load port 102.

The overhead transport vehicle 1 includes a traveler 2, a lateral mover 3, a rotator 4, an elevator 5, a holder 6, and a controller 7. The traveler 2 travels along the traveling rail 101 by receiving power supply in a non-contact manner from a high frequency current line laid along the traveling rail 101. The lateral mover 3 horizontally moves the rotator 4, the elevator 5, and the holder 6 with respect to the direction in which the traveling rail 101 extends. The rotator 4 rotates the elevator 5 and the holder 6 within a horizontal plane. The elevator 5 raises and lowers the holder 6 by winding and paying out a plurality of belts 5a each of lower ends of which has the holder 6 attached thereto. The holder 6 holds a flange 91 of the FOUP 90 by opening and closing a pair of claws 6a. The controller 7 is configured or programmed to control operations of respective portions of the overhead transport vehicle 1.

Figure 2:
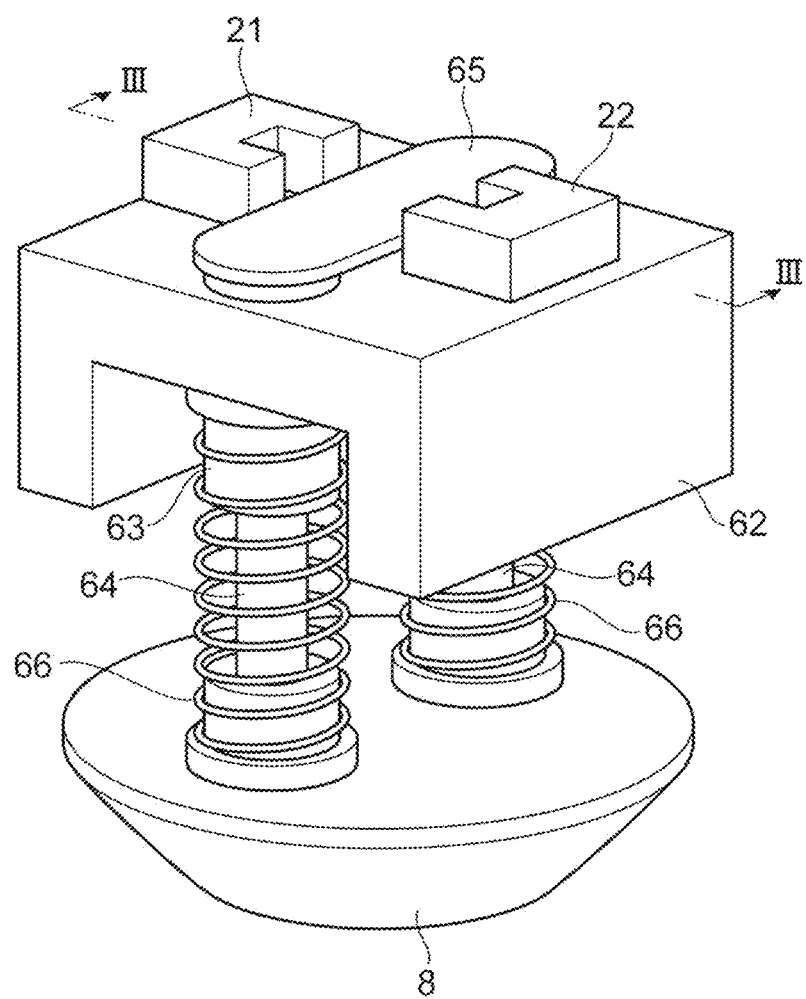
FIG. 2 is a perspective view of a center cone and peripheral portions thereof in FIG. 1.
Figure 3:
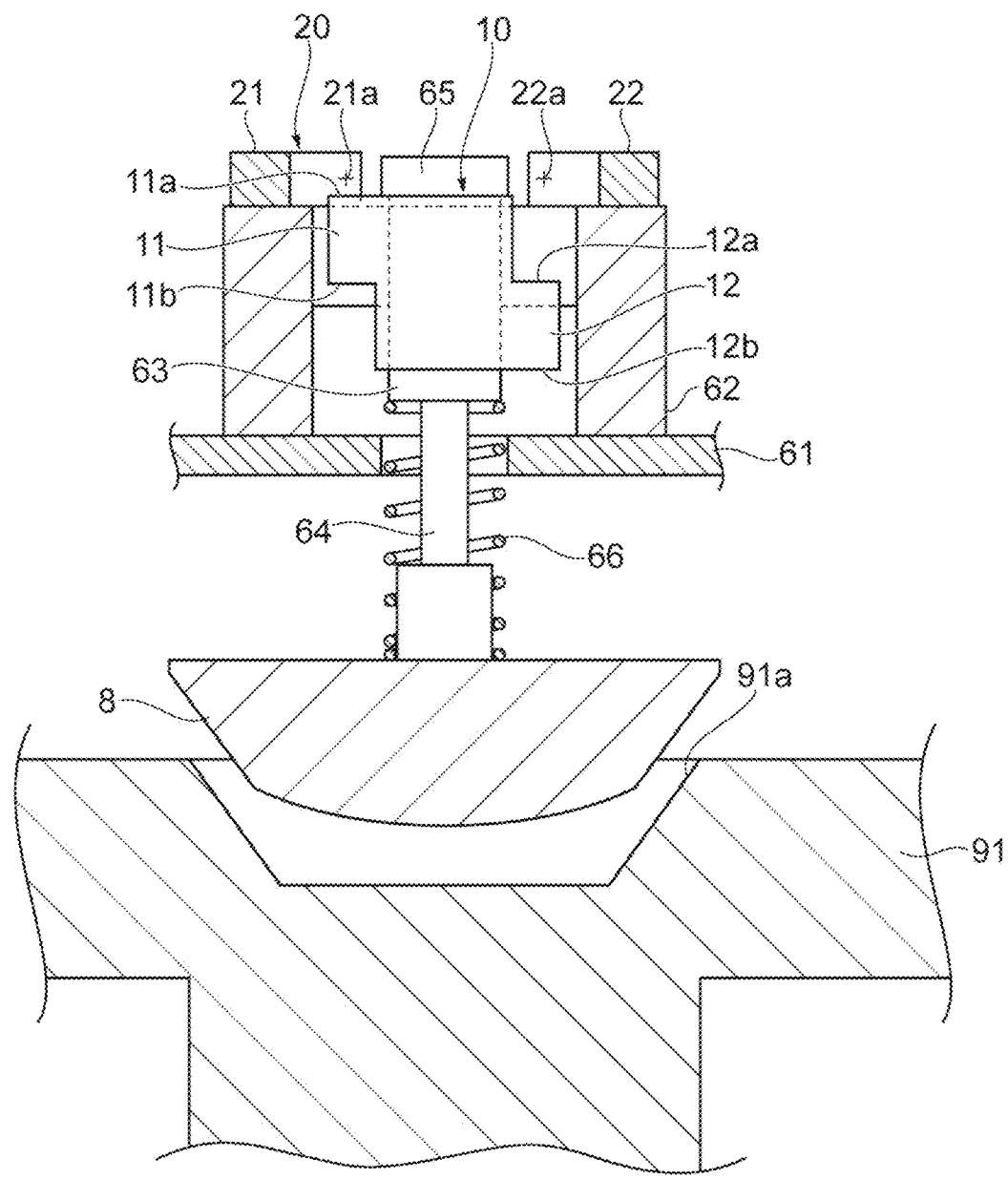
FIG. 3 is a sectional view along a line in FIG. 2.

The overhead transport vehicle 1 further includes a center cone (positioner) 8, a dog 10, and a detector 20. The center cone 8 is structured to engage with a recess 91a in the flange 91, so as to position the holder 6 with respect to the FOUP 90. The center cone 8, the dog 10, and the detector 20 are provided to the holder 6. More specifically, as depicted in FIG. 2 and FIG. 3, the center cone 8, the dog 10, and the detector 20 are supported by a support 62 provided to a base 61 of the holder 6. In FIG. 2, illustration of the base 61 is omitted.

The support 62 includes a pair of guides 63 fixed thereto. Each of the guides 63 is a tube extending in a perpendicular or substantially perpendicular direction. The guides 63 have respective rods 64 inserted thereto. Respective upper ends of the rods 64 are coupled to each other via a coupler 65. The center cone 8 is attached to respective ends of the rods 64. A coil spring 66 is disposed between the center cone 8 and each of the guides 63 with each of the rods 64 inserted thereto. A pair of the coil springs 66 energize the center cone 8 to the lower side with respect to the support 62. With the above-mentioned configuration, the center cone 8 ascends and descends with respect to the holder 6 assuming that a position at which the coupler 65 abuts the respective upper ends of the guides 63 is an initial position.

The dog 10 includes a first screen 11 and a second screen 12. The first screen 11 and the second screen 12 preferably are integrally formed, for example, by using a metal plate, and are fixed to the coupler 65. With this configuration, the first screen 11 and the second screen 12 ascend and descend in association with ascending and descending operations of the center cone 8 with respect to the holder 6. The first screen 11 has a first upper end 11a and a first lower end 11b horizontally parallel or substantially parallel to each other. The second screen 12 includes a second upper end 12a and a second lower end 12b horizontally parallel or substantially parallel to each other. A distance between the first upper end 11a and the first lower end 11b is equal to a distance between the second upper end 12a and the second lower end 12b. The first lower end 11b and the second upper end 12a are positioned at the same height (vertically the same position).

The detector 20 includes a first photo interrupter 21 and a second photo interrupter 22. The first photo interrupter 21 is attached to the support 62 such that the first screen 11 can pass over an optical axis 21a of the first photo interrupter 21 (between a light emitter and a light receiver of the first photo interrupter 21). With this configuration, the first photo interrupter 21 can detect a position of the first screen 11. The second photo interrupter 22 is attached to the support 62 such that the second screen 12 can pass over an optical axis 22a of the second photo interrupter 22 (between a light emitter and a light receiver of the second photo interrupter 22). With this configuration, the second photo interrupter 22 can detect a position of the second screen 12. The optical axis 21a of the first photo interrupter 21 and the optical axis 22a of the second photo interrupter 22 are positioned at the same height (vertically the same position). In a state in which the center cone 8 is in an initial position (specifically, the coupler 65 abuts the upper end of each of the guides 63), the first upper end 11a of the first screen 11 is positioned in a side lower than the optical axis 21a of the first photo interrupter 21.

As described above, the first screen 11 and the second screen 12 of the dog 10 ascend and descend in association with the ascending and descending operations of the center cone 8 with respect to the holder 6. The first photo interrupter 21 and the second photo interrupter 22 of the detector 20 can respectively detect positions of the first screen 11 and the second screen 12. Specifically, the detector 20 detects a position of the dog 10, so as to detect a relative ascending operation of the center cone 8 with respect to the holder 6.

One example of the operation of the thus configured overhead transport vehicle 1 will now be described in detail with reference to FIGS. 4 to 7. The following describes one example of the operation of the overhead transport vehicle 1 to recover the FOUP 90 disposed on the mounting surface 102a of the load port 102.

As depicted in FIG. 4A, first, the controller 7 causes the traveler 2 to stop traveling at a predetermined position in an upper portion of the load port 102, and causes the elevator 5 to start lowering the holder 6. At that time, as depicted in FIG. 4B, the center cone 8 is in an initial position (specifically, the coupler 65 abuts the upper end of each of the guides 63), and the first upper end 11a of the first screen 11 is positioned in a side lower than the optical axis 21a of the first photo interrupter 21. Specifically, output from the light receiver of the first photo interrupter 21 and output from the light receiver of the second photo interrupter 22 are both in an on state.

As depicted in FIG. 5A, when the holder 6 is further lowered by the elevator 5, the center cone 8 engages with the recess 91a of the flange 91 as depicted in FIG. 5B, and the center cone 8 and the first screen 11 and the second screen 12 begin relatively ascending with respect to the holder 6 being lowered by its self-weight. The first upper end 11a of the first screen 11 reaches the optical axis 21a of the first photo interrupter 21 from the lower side, and output from the light receiver of the first photo interrupter 21 turns off from on. Consequently, the controller 7 recognizes that the FOUP 90 is disposed on the mounting surface 102a of the load port 102 (FOUP 90 is present on the mounting surface 102a of the load port 102). Specifically, the controller 7 recognizes that the FOUP 90 is disposed on the mounting surface 102a of the load port 102 when the detector 20 detects an ascending operation in a case where the holder 6 is lowered by the elevator 5.

Figure 6B:
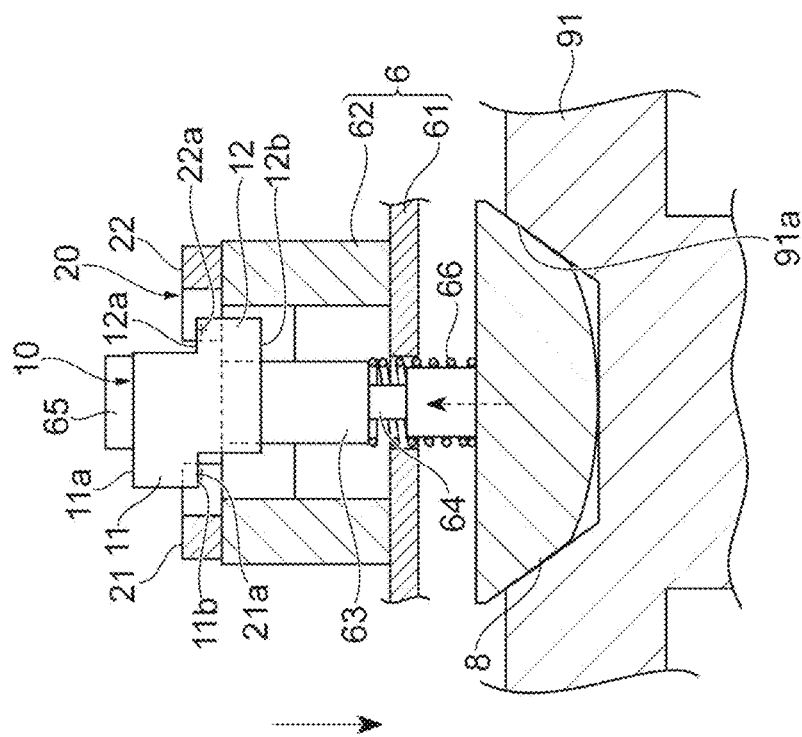
FIGS. 6A and 6B are explanatory views of operations of the overhead transport vehicle in FIG. 1.
Figure 6A:
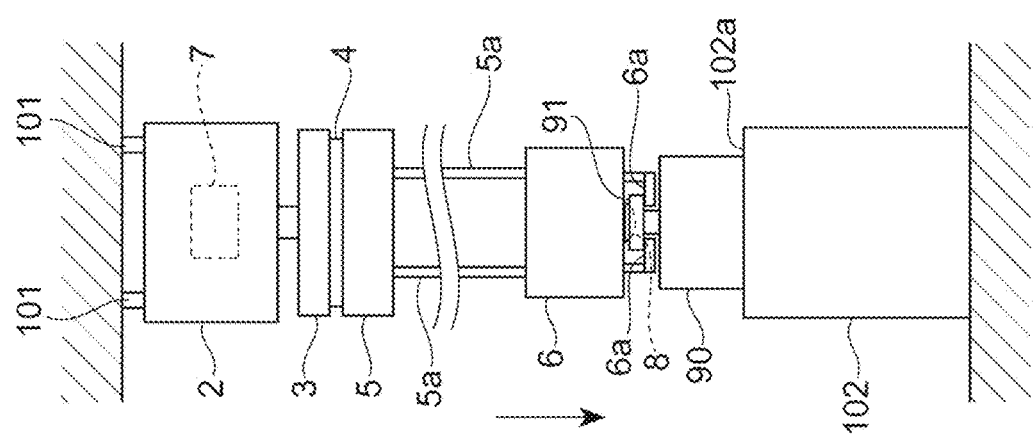

As depicted in FIG. 6A, when the holder 6 is further lowered by the elevator 5, the center cone 8 and the first screen 11 and the second screen 12 relatively further ascends with respect to the holder 6 being lowered by its self-weight, as depicted in FIG. 6B. Then, the second upper end 12*a* of the second screen 12 reaches the optical axis 22*a* of the second photo interrupter 22 from the lower side, and output from the light receiver of the second photo interrupter 22 turns off from on. At that time, the first lower end 11*b* of the first screen 11 reaches the optical axis 21*a* of the first photo interrupter 21 from the lower side, and output from the light receiver of the first photo interrupter 21 turns on from off. Consequently, the controller 7 recognizes that the holder 6 reaches the holding position (position at which the pair of claws 6*a* can advance to a lower side of the flange 91 when the pair of claws 6*a* are closed). Specifically, the controller 7 recognizes that the holder 6 reaches the holding position when the detector 20 further detects an ascending operation in a case where the holder 6 is further lowered by the elevator 5.

Figure 7A:
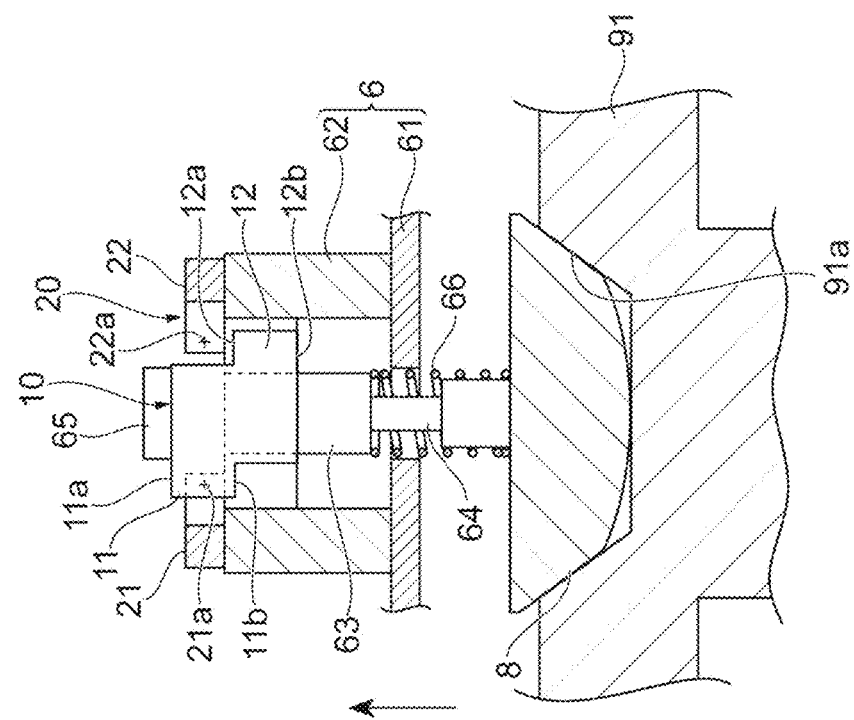
FIGS. 7A and 7B are explanatory views of operations of the overhead transport vehicle in FIG. 1.
Figure 7B:
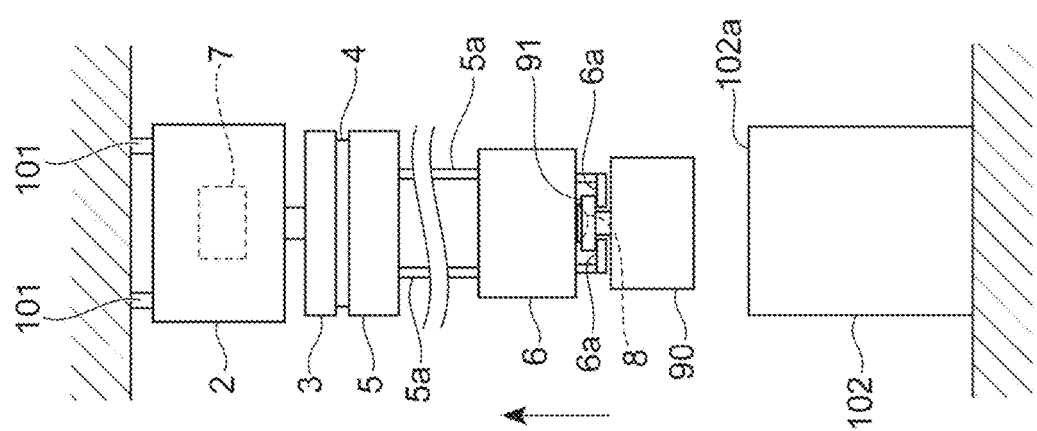

When recognizing that the holder 6 reaches the holding position, the controller 7 stops the holder 6 being lowered by the elevator 5 lowering, allows the holder 6 to close the pair of claws 6*a*, and as depicted in FIG. 7A, starts the holder 6 being raised by the elevator 5. After that, until the upper surface of the pair of the claws 6*a*, which has advanced to the lower surface of the flange 91, abuts the lower end of the flange 91, the center cone 8 and the first screen 11 and the second screen 12 relatively descend with respect to the holder ascending. When the upper surface of the pair of claws 6*a* abut the lower surface of the flange 91, as depicted in FIG. 7B, the first lower end 11*b* of the first screen 11 reaches the optical axis 21*a* of the first photo interrupter 21 from the upper side, output from the light receiver of the first photo interrupter 21 turns on from off. At that time, the second upper end 12*a* of the second screen 12 reaches the optical axis 22*a* of the second photo interrupter 22 from the upper side, and the output from the light receiver of the second photo interrupter 22 turns on from off. Consequently, the controller 7 recognizes that the holder 6 holds the flange 91 of the FOUP 90.

When the holder 6 holding the flange 91 of the FOUP 90 is raised by the elevator 5 and the holder 6 reaches the predetermined position, the controller 7 stops the holder 6 being raised by the elevator 5, and causes the traveler 2 to start traveling. The foregoing is one example of the operation of the overhead transport vehicle 1 to recover the FOUP 90 disposed on the mounting surface 102*a* of the load port 102.

One example of the operation of the overhead transport vehicle 1 to dispose the FOUP 90 on the mounting surface 102*a* of the load port 102 is opposite to one example of the operation of the overhead transport vehicle 1 to recover the FOUP 90 disposed on the mounting surface 102*a* of the load port 102.

First, the controller 7 causes the traveler 2 to stop traveling at a predetermined position in an upper portion of the load port 102, and causes the elevator 5 to start lowering the holder 6. At that time, output from the light receiver of the first photo interrupter 21 is in off state, and output from the light receiver of the second photo interrupter 22 is in on state (see FIG. 7B). When the holder 6 holding the flange 91 of the FOUP 90 is lowered by the elevator 5, the FOUP 90 is disposed on the mounting surface 102*a* of the load port 102. In this state, when the holder 6 is further lowered by the elevator 5, as depicted in FIG. 6B, the center cone 8 and the first screen 11 and the second screen 12 relatively further ascend with respect to the holder 6 being lowered by its self-weight. After that, the second upper end 12*a* of the second screen 12 reaches the optical axis 22*a* of the second photo interrupter 22 from the lower side, and output from the light receiver of the second photo interrupter 22 turns off from on. At that time, the first lower end 11*b* of the first screen 11 reaches the optical axis 21*a* of the first photo interrupter 21 from the lower side, and output from the light receiver of the first photo interrupter 21 turns on from off. Consequently, the controller 7 recognizes that the holder 6 reaches the holding position (position at which the pair of claws 6*a* can advance to a lower side of the flange 91 when the pair of claws 6*a* are open). The controller 7, when recognizing that the holder 6 has reached a position of cancelling the holding, causes the elevator 5 to stop lowering the holder 6, the holder 6 to open the pair of the claws 6*a*, and the elevator 5 to start raising the holder 6. When the holder 6 is raised by the elevator 5 and the holder 6 reaches the predetermined position, the controller 7 causes the elevator 5 to stop raising the holder 6, and the traveler 2 to start traveling.

As described above, the overhead transport vehicle 1 detects a relative ascending operation of the center cone 8 with respect to the holder 6, so as to recognize that the FOUP 90 is disposed on the mounting surface 102*a* of the load port 102. Consequently, for example, unlike an overhead transport vehicle configured to detect the flange 91 of the FOUP 90 using a light emitting and receiving type optical sensor, the overhead transport vehicle 1 is not affected by a shape, a color, or other features of the flange 91. Thus, in the overhead transport vehicle 1 thus configured, it is possible to accurately recognize that the FOUP 90 is disposed on the mounting surface 102*a* of the load port 102.

The controller 7 recognizes that the holder 6 reaches the holding position when the detector 20 further detects an ascending operation in a case where the holder 6 is further lowered by the elevator 5. Consequently, it is possible to accurately recognize that the holder 6 reaches the holding position.

In particular, in the above configuration, in which a relative ascending operation of the center cone 8 with respect to the holder 6 is detected, a high detection accuracy is achieved. This is because, for example, a thickness of the flange 91 is not standardized, but dimensions of the recess 91*a* with which the center cone 8 engages is standardized with the bottom surface of the FOUP 90 as a height reference.

Furthermore, the detector 20 detects the position of the dog 10 ascending and descending in association with ascending and descending operations of the center cone 8 with respect to the holder 6. Consequently, with a simple configuration, it is possible to detect a relative ascending operation of the center cone 8 with respect to the holder 6.

The dog 10 includes the first screen 11 including the first upper end 11*a* and the first lower end 11*b*, and the second screen 12 including the second upper end 12*a* and the second lower end 12*b*. The detector 20 includes the first photo interrupter 21 to detect the position of the first screen 11 and the second photo interrupter 22 to detect the position of the second screen 12. The first lower end 11*b* and the second upper end 12*a* are positioned at the same height, and the optical axis 21*a* of the first photo interrupter 21 and the optical axis 22*a* of the second photo interrupter 22 are positioned at the same height. This configuration makes it possible to perform determination based on both output from the light receiver of the first photo interrupter and output from the light receiver of the second photo interrupter 22, thus detecting a relative ascending operation of the center cone 8 with respect to the holder 6 more accurately.

It is noted that in the above configuration, to stop the holder 6 being lowered by the elevator 5, after the on and off state of output from the light receiver of the first photo interrupter 21 and output from the light receiver of the second photo interrupter 22 are switched, the holder 6 is moved by several millimeters, for example, to stop (see FIG. 6B). This arrangement prevents chattering from occurring in the output from the light receiver of the first photo interrupter 21 and output from the light receiver of the second photo interrupter 22.

Moreover, in the above configuration, both the output from the light receiver of the first photo interrupter 21 and output from the light receiver of the second photo interrupter 22 are not turned off simultaneously. Therefore, by checking both outputs are turned off simultaneously, it is possible to recognize that at least one of the first photo interrupter 21 and the second photo interrupter 22 has a failure.

Moreover, if a set of the first screen 11 and the first photo interrupter 21 is only used for determination, the following problem can occur. Specifically, the holder 6 diagonally holds the flange 91 of the FOUP 90, and thus when the output from the light receiver of the first photo interrupter 21 is turned on (normally, as depicted in FIG. 7B, the output from the light receiver of the first photo interrupter 21 is turned off), the controller 7 recognizes that the holder 6 does not hold the flange 91 of the FOUP 90, and can cause the pair of claws 6a to open. The above-mentioned situation is able to be prevented by performing determination based on both of a set of the first screen 11 and the first photo interrupter 21, and a set of the second screen 12 and the second photo interrupter 22; specifically, when at least one of the output from the light receiver of the first photo interrupter 21 and the output from the light receiver of the second photo interrupter 22 is turned off, a pair of claws 6a are not caused to open.

Moreover, since photo micro sensors such as photo interrupters are generally less expensive compared with an optical sensor of light emitting and receiving type, the above configuration is beneficial also from viewpoints of costs. Furthermore, the first photo interrupter 21 and the second photo interrupter 22 are disposed in the upper side of the base 61 in the holder 6, that is, inside the holder 6. This configuration provides such advantages that the overhead transport vehicle is not easily affected by disturbance light, protected from a physical contact from the outside, provides easy routing, and provides high degree of freedom in designing a pair of claws 6a.

Although the foregoing describes preferred embodiments of the present disclosure, the present disclosure is not limited to the above-mentioned preferred embodiments. For example, it is also possible to detect a relative ascending operation of the center cone 8 with respect to the holder 6 using only one set of the first screen 11 and the first photo interrupter 21. Moreover, if it is possible to detect a relative ascending operation of the center cone 8 with respect to the holder 6, the detector 20 is not limited to the above-mentioned configuration. Furthermore, if it is possible for the positioner to engage with a certain recess in the flange 91 of the FOUP 90, the positioner is not limited to the center cone 8. In addition, a container other than the FOUP 90 may be applicable.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An overhead transport vehicle comprising:
a traveler to travel along a traveling rail;
an elevator provided to the traveler;
a holder to be raised and lowered by the elevator and to hold a flange included in a container;
a positioner to ascend and descend with respect to the holder and to engage with a recess formed in the flange;
a detector to detect a relative ascending operation of the positioner with respect to the holder;
a controller to recognize that the container is disposed on a mounting surface of a transfer destination when the detector detects the ascending operation in a case where the holder is lowered by the elevator; and
a dog to ascend and descend in association with ascending and descending operations of the positioner with respect to the holder; wherein
the detector detects a position of the dog;
the dog includes a first screen including a first upper end and a first lower end, and a second screen including a second upper end and a second lower end;
the detector includes a first photo interrupter to detect a position of the first screen, and a second photo interrupter to detect a position of the second screen;
the first lower end and the second upper end are positioned at a same height; and
an optical axis of the first photo interrupter and an optical axis of the second photo interrupter are positioned at a same height.

2. The overhead transport vehicle according to claim 1, wherein the controller recognizes that the holder reaches a holding position when the detector detects an ascending operation in a case where the holder is lowered by the elevator.

* * * * *